(12) United States Patent
Bako et al.

(10) Patent No.: US 11,025,229 B2
(45) Date of Patent: Jun. 1, 2021

(54) COMPENSATION FOR BINARY WEIGHTED DIVIDER

(71) Applicant: TEXAS INSTRUMENTS INCORPORATED, Dallas, TX (US)

(72) Inventors: Niko Bako, Freising (DE); Stefan Reithmaier, Vilsheim (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/588,121

(22) Filed: Sep. 30, 2019

(65) Prior Publication Data

US 2020/0266799 A1 Aug. 20, 2020

Related U.S. Application Data

(60) Provisional application No. 62/807,162, filed on Feb. 18, 2019.

(51) Int. Cl.
| | |
|---|---|
| *H03H 11/24* | (2006.01) |
| *H03F 3/45* | (2006.01) |
| *H02M 3/158* | (2006.01) |
| *H02M 1/08* | (2006.01) |

(52) U.S. Cl.
CPC .............. *H03H 11/24* (2013.01); *H02M 1/08* (2013.01); *H02M 3/158* (2013.01); *H03F 3/45071* (2013.01); *H03F 2200/129* (2013.01); *H03F 2203/45116* (2013.01); *H03F 2203/45528* (2013.01); *H03F 2203/45534* (2013.01)

(58) Field of Classification Search
CPC ................................ H02M 1/08; H02M 3/158
See application file for complete search history.

(56) References Cited

U.S. PATENT DOCUMENTS

| | | | | |
|---|---|---|---|---|
| 4,160,244 A | | 7/1979 | Solomon et al. | |
| 5,389,928 A | * | 2/1995 | Coppero | H03M 1/662 |
| | | | | 341/144 |
| 5,648,780 A | * | 7/1997 | Neidorff | H03M 1/682 |
| | | | | 341/145 |
| 6,307,495 B1 | | 10/2001 | Mahant-Shetti et al. | |
| (Continued) | | | | |

OTHER PUBLICATIONS

International Search Report dated May 21, 2020, PCT Application No. PCT/US2020/018858, 2 pages.

(Continued)

*Primary Examiner* — John W Poos
(74) *Attorney, Agent, or Firm* — Michelle F. Murray; Charles A. Brill; Frank D. Cimino (57) ABSTRACT

A circuit includes a binary weighted divider having a first set of switches coupled in series between an input node and a feedback node. The first set of switches is configured to set a feedback voltage at the feedback node in response to activating or deactivating respective switches in the first set of switches. A set of compensation switches is coupled to the first set of switches. The set of compensation switches is configured to reduce resistance of one or more of the respective switches in the first set of switches that are activated by activating one or more switches in the set of compensation switches to provide one or more respective parallel current paths for each of the switches in the first set of switches that are activated.

24 Claims, 9 Drawing Sheets

(56) References Cited

U.S. PATENT DOCUMENTS

| | | | |
|---|---|---|---|
| 6,937,178 B1* | 8/2005 | Rempfer | H03M 1/0678 |
| | | | 341/144 |
| 2004/0174150 A1* | 9/2004 | Zhang | G11C 5/147 |
| | | | 323/274 |
| 2009/0295462 A1 | 12/2009 | Itoh | |
| 2014/0266127 A1 | 9/2014 | Sun | |

OTHER PUBLICATIONS

Written Opinion dated May 21, 2020, PCT Application No. PCT/US2020/018858, 5 pages.

* cited by examiner

COMPENSATION FOR BINARY WEIGHTED DIVIDER

CROSS REFERENCE TO RELATED APPLICATIONS

This application claims the benefit of U.S. Provisional Patent Application 62/807,162 filed on 18 Feb. 2019, and entitled BINARY WEIGHTED RESISTIVE DIVIDER WITH HIGH ACCURACY, the entirety of which is incorporated herein by reference.

TECHNICAL FIELD

This disclosure relates to compensation for a binary weighted divider circuit.

BACKGROUND

Weighted dividers, such as binary weighted dividers and array dividers, utilize switch settings in response to digital binary commands to set precise analog voltages. The switch settings select different resistor combinations in the dividers to adjust the desired value of the analog voltage. One example application for such voltage setting relates to setting output voltage accuracy of direct-current (DC)/DC converters that may be controlled within range (e.g., ±1%) of the output voltage (VOUT) for the converter. For example, the output voltage may be set by a resistive divider which can be connected to an output voltage DC/DC converter pin VOUT, a DC/DC converter error amplifier feedback pin, and ground. Often, the output voltage can be changed in small voltage steps while the output voltage range is wide. The voltage can be adjusted by changing a resistor value in the resistive divider by selecting switches that enable or disable resistors in the divider. If the voltage step is 25 millivolt (mV), and if the voltage range of the converter is from 1.825 V to 5 V, for example, then 128 possible values (7-bits) of the output voltage of the converter in this range can be specified. Resistor dividers are not only used for setting DC/DC converter output voltages, they are also used for trimming applications such as providing a programmable reference voltage, a programmable bias current, and so forth.

SUMMARY

In one example, a circuit includes a binary weighted divider having a first set of switches coupled in series between an input node and a feedback node. The first set of switches is configured to set a feedback voltage at the feedback node in response to activating or deactivating respective switches in the first set of switches. A set of compensation switches is coupled to the first set of switches. The set of compensation switches is configured to reduce resistance of one or more of the respective switches in the first set of switches that are activated by activating one or more switches in the set of compensation switches to provide one or more respective parallel current paths for each of the respective switches in the first set of switches that are activated.

In another example, a device includes a first resistor coupled between a first node and a second node. A first switch is coupled in parallel with the first resistor between the first node and the second node. A second resistor is coupled between the second node and a third node. A second switch is coupled in parallel with the second resistor between the second node and the third node. A third switch is coupled between the first node and the second node. A fourth switch is coupled between the second node and the third node. An amplifier having a first input is coupled to the third node and a second input adapted to be coupled to a reference voltage. The amplifier has an output coupled to the first node.

In yet another example, A system includes a binary weighted divider having a resistor network that includes a sequence of N weighted resisters coupled in series between an input node and a feedback node. A first set of switches coupled is in series between the input node and the feedback node. The first set of switches is configured to set a feedback voltage at the feedback node in response to activating or deactivating respective switches in the first set of switches. An amplifier is configured to provide an input voltage to the input node based on a reference voltage and a feedback voltage from the feedback node. A set of compensation switches is coupled to the first set of switches. The set of compensation switches is configured to reduce resistance of one or more of the respective switches in the first set of switches that are activated by activating one or more switches in the set of compensation switches to provide one or more respective parallel current paths for the one or more respective switches in the first set of switches that are activated. A control logic circuit is configured to control activation and deactivation of the first set of switches and the set of compensation switches based on an input code specifying a resistance of the binary weighted divider.

DETAILED DESCRIPTION

This disclosure relates to impedance compensation for a binary weighted divider. For example, a circuit including a binary weighted divider can include a compensation switch network configured to reduce switch resistance of switches in the binary weighted divider that are activated. Reducing switch resistance of activated switches allows selected resistors in the divider to more accurately reflect their associated resistor values while also being less impacted by switch resistance as in existing dividers. The compensation switch network thus improves accuracy of the divider over existing types of divider circuits. The compensation switch network also enables a reduced integrated circuit die area for a divider circuit compared to existing divider circuits having similar performance. Smaller die areas can be used because smaller switches, which have larger switch resistances than larger switches typically used in existing divider circuits, can now be used because their respective resistances are lowered by the compensation switch network. That is, the compensation switch network lowers overall resistance of activated switches in the divider by providing parallel current paths through respective compensation switches. The compensation switch network can also reduce parasitic capacitance in existing divider circuits because smaller switches and minimal switch configurations can be implemented in a smaller area for the divider. Furthermore, in contrast to existing types of array-divider circuits that implement an exponential number of switches and resistors depending on the number of bits employed, the binary weighted divider and compensation network, as described herein, can be implemented using a fewer number of resistors and switches than the existing array-divider circuits while still providing similar or improved least significant bit accuracy to the existing array-divider circuits.

Figure 1:
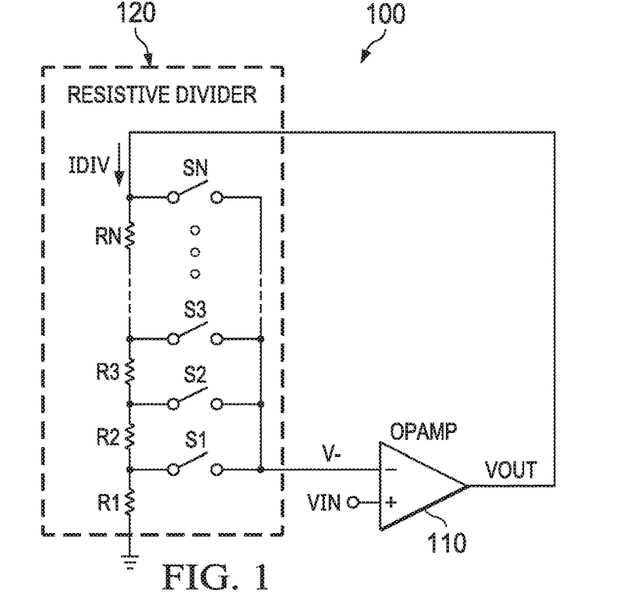
FIG. 1 illustrates a resistive divider circuit.
Figure 2:
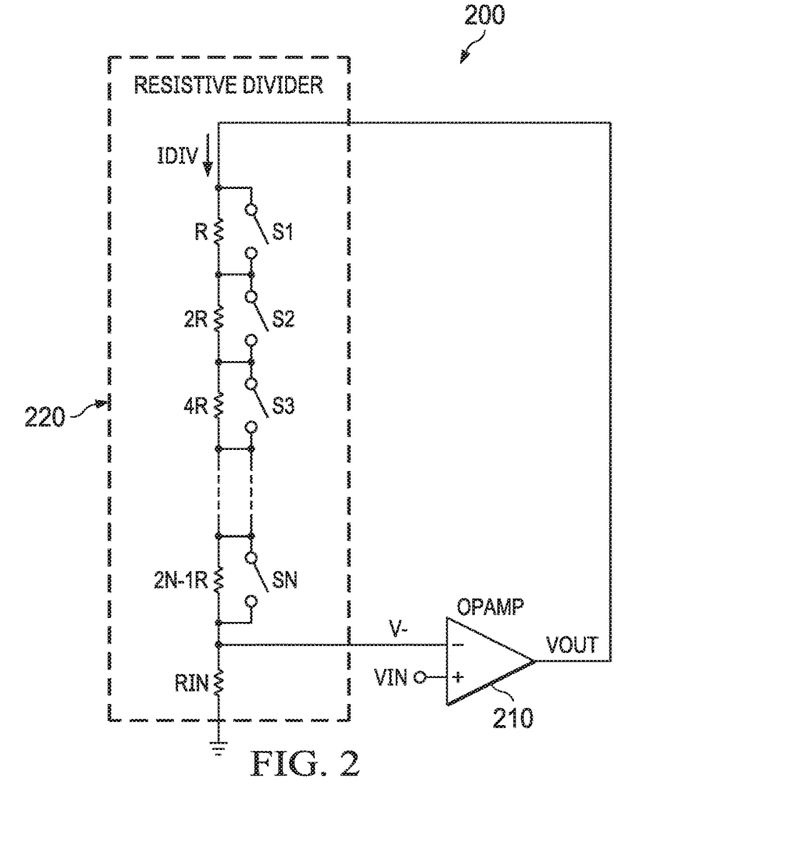
FIG. 2 illustrates another type of a resistive divider.

To demonstrate benefits of the compensation switch network described herein, FIGS. 1 and 2 illustrate existing types of resistive dividers that do not include compensation for the divider as described herein. FIG. 1 illustrates a circuit 100 that includes an array divider and FIG. 2 illustrates a circuit 200 that includes a binary weighted divider. Neither the circuit 100 or circuit 200 employ the compensation switch network as described herein.

Turning to FIG. 1, the circuit 100 includes an amplifier 110 that provides an output voltage VOUT. The output voltage VOUT is fed back to an input of a resistive divider 120 that includes resistors R1 through RN, with N being a positive integer. Respective resistors in the resistive divider 120 are selected or deselected by controlling respective switches S1 though SN. The switches, which control which resistors are connected between the input and output, scale the amount of output voltage VOUT applied to a negative input of the amplifier 110 shown as V−. The positive input of the amplifier is tied to a reference voltage VIN from which the output VOUT is adjusted according to the switches S1 through SN that are selected.

The output voltage VOUT can be described according to the equation Vout=Vin*(Rtotal/Rin), where Rin is sum of resistance looking from the node V− of the amplifier 110 to ground and Rtotal is sum of divider resistance looking from RN to ground (Rtotal=R1+R2+ . . . +RN). In FIG. 1, one side of switches S1 to SN are connected in series to the amplifier 110 high-impedance input node V−. This array-divider approach mitigates influence of the switches on VOUT but a disadvantage is that the resistors (R1 through RN) can provide a nonlinear scaling of VOUT to provide various output voltage combinations. In an example 2-bit divider having 4 resistors with equal resistor values (R1=R2=R3=R4=R), Rtotal=4R and Rin can be, depending on input code, Rin=[R, 2R, 3R and 4R] which implies that VOUT can be Vout=[4Vin, 2Vin, 4/3Vin and Vin]. From this 2-bit example, it is apparent that the divider of the circuit 100 is not linear, where Vout=3Vin is not supported.

In addition to nonlinear behavior, another disadvantage of the circuit 100 is the large number of switches involved. For example, the number of switches in the divider is exponentially proportional to the number of bits, where the total number of resistor and switches is $2^N$ and N is the number of bits. Due to the large number of switches to select a desired voltage value for VOUT where there is one switch for each resistor that grows exponentially per the number of bits in divider, the corresponding integrated circuit die area to implement the circuit 100 tends to be much larger than the binary weighted divider in FIG. 2 which in turn increases the cost of the circuit 100.

The circuit 200 of FIG. 2 illustrates a binary weighted divider circuit. The circuit 200 overcomes some of the issues with the circuit 100 of FIG. 1, such as non-linear operation and large number of resistors and switches to adjust VOUT. In this example, the respective switches are sized large, having large length and width parameters to reduce switch resistance in order to have a small resistance and so as not to influence accuracy of the divider. When the switches are too large, however, switch parasitic capacitance can increase and degrade performance of the divider because unwanted signals can couple through the parasitic capacitance. The circuit 200 includes amplifier 210 that generates VOUT and drives a resistive divider 220 representing a binary weighed resistor with resistor segments of R, 2R, 4R, . . . , $2^{N-1}$R connected in series where R is a unit resistor.

Changing resistor values in the circuit 200 may be performed by selecting a metal oxide semiconductor (MOS) switch which shorts one or more resistor segments (R, 2R, 4R, . . . , $2^{N-1}$R) in the resistive divider 220. However, the MOS switches also have relatively high resistance. In cases where more than one MOS switch is active, the switch resistance is added together to introduce inaccuracy in a resulting division ratio of the resistive divider 220. Inaccuracy, is more pronounced for least significant bits (LSBs) of the divider where resistance of the switches is connected in series with LSB resistor segments (e.g., R or 2R), which has the smallest value in the resistive divider 220. For example, in the case of a 7-bit binary weighted divider, the worst-case inaccuracy can be determined when all switches except the LSB (least significant bit) are active because overall resistance of the resistive divider 220 is sum of resistance of 6 switches plus resistance R of unit resistor. In practice, the unit resistor R should not be too large because the most significant bit (MSB) is $(2^{N-1})$*R. For example, a 7-bit MSB divider would be 64R which leads to a large integrated circuit die area occupied by divider.

The compensation switch network and binary weighted divider described herein (see, e.g., FIGS. 3-6) overcome the deficiencies of both of the circuit 100 and circuit 200. By employing a binary weighted divider and compensation switch network in a divider circuit, as described herein, non-linearities and large switch combinations and resistor die areas may be reduced in the divider circuit because a smaller number of linear resistor and switch combinations can be employed to adjust VOUT. For example, in a 5-bit example, the total number of switches to implement the binary weighted divider and compensation switch network is 15 whereas with array divider of the circuit 100 of FIG. 1, 32 switches are implemented to provide a 5-bit divider. Moreover, accuracy of the least significant bits of the binary weighted divider is improved over the circuit 200 illustrated in FIG. 2 because the compensation switch network described herein is configured to activate compensation switches to provide parallel current paths to reduce the resistance of the activated switches in the resistive divider. The compensation switch network also allows selection switches to be implemented in the binary weighted divider with smaller die area to reduce parasitic capacitance and allows for lower cost for integrated circuit implementations over existing binary weighted divider circuits.

As used herein, the term "circuit" can include a collection of active and/or passive elements that perform a circuit function, such as an analog circuit or digital circuit. Additionally or alternatively, for example, the term "circuit" can include an IC where all or some of the circuit elements are fabricated on a common substrate (e.g., semiconductor substrate, such as a die or integrated circuit chip), such as disclosed herein. For example, the circuit and/or associated control circuitry may be implemented as a respective IC chip or within a multi-chip module. A control logic circuit can include discrete components configured to execute a control function. In other examples, the control logic circuit can include a controller, processor, digital signal processor, or gate array.

Additionally, the term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Figure 3:
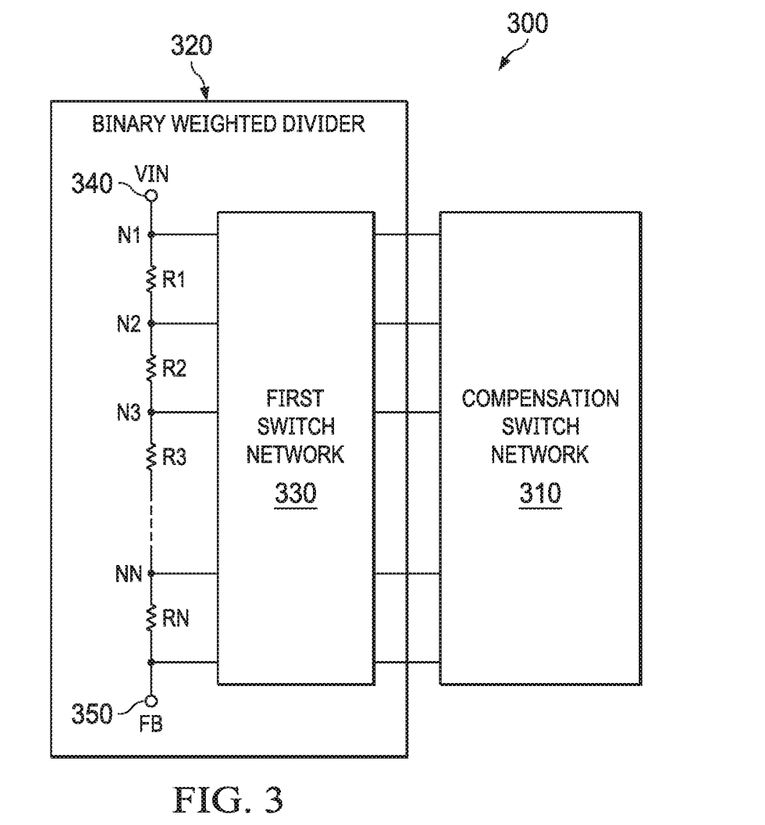
FIG. 3 illustrates an example block diagram of a circuit that includes a compensation network to reduce switch resistance of a binary weighted divider.

FIG. 3 illustrates an example of a circuit 300 that includes a compensation switch network 310 configured to reduce switch resistance of a binary weighted divider 320. The binary weighted divider 320 includes a first switch network 330 having a first set of switches coupled in series between an input node 340 and a feedback node 350. The first set of switches in the first switch network 330 is configured to set a feedback voltage at the feedback node 350 in response to activating or deactivating respective switches in the first set of switches. For example, an input code such as a binary word specifying a resistor control code is applied to input terminals of the first set of switches in the first switch network 330 to select which switches are activated and deactivated and thereby set the resistance of the binary weighted divider 320 between the input node 340 and the feedback node 350.

The compensation switch network 310 includes a set of compensation switches coupled to the first set of switches in the first switch network 330. The set of compensation switches are configured to reduce resistance of one or more of the respective switches in the first set of switches that are activated by activating one or more switches in the set of compensation switches. Activated switches in the compensation network provide one or more respective parallel current paths for each of the switches in the first set of switches that are activated. By activating compensation switches based on the activated switches in the first switch network 330, one or more parallel current paths are established through switches in the compensation switch network 310 for respective switches in the first set of switches that are activated to reduce the resistance of the activated switches in the first switch network. By reducing switch resistance of the first switch network 330 with the compensation switch network, accuracy of the binary weighted divider 320 is improved while also allowing smaller switches having larger resistance values to be implemented in the divider. As a result, overall integrated circuit die area in the circuit 300 can be reduced compared to existing divider circuits (e.g., FIGS. 1 and 2).

By way of example, similar to a parallel resistor network, the compensation switch network 310 provides a parallel switch resistance in parallel to the switch resistance of the activated switches in the first switch network 330. This allows electrical current from the input node 340 to flow through activated switches in both the first switch network 330 and the compensation switch network 310. Thus, these parallel switch circuits act as current dividers. Therefore, switches (each having a respective switch resistance) are connected such that more than one current path is established from a common voltage source (e.g., voltage from VIN at input node 340) which lowers the effective switch resistance of respective switches that are activated in the first switch network 330. Thus, the equivalent resistance based on the compensation switch network 310 being activated is lowered similar to adding parallel resistors in a parallel resistor network. By providing one or more respective parallel current paths to current flowing through the activated switches in the first switch network 330, overall switch resistance is less than the resistance of the smallest resistance provided by a given activated switch.

In the example of FIG. 3, the binary weighted divider 320 includes a set of N resistors shown as R1, R2, R3, through RN with N being a positive integer greater than two. The N resistors are coupled in series between the input node 340 and the feedback node 350 and are sized to have an increasing resistance from the input node to the feedback node. Thus, the respective resistors R1 through RN are configured such that a first resistor in the series coupled to the input node 340 has a lower resistance value than a subsequent resistor in the series coupled to the feedback node 350. For the example of a binary weighted divider 320, the resistance value of R1 is set at a unit resistor value (e.g., 1K ohm) and each succeeding resistor in the sequence of resistors between input node 340 and feedback node 350 is sized at twice the resistance value of an immediately preceding resistor in the sequence. As shown, the first resistor R1 in the set of N resistors is coupled to the input node 340 and an intermediate node between resistors R1 and R2. Each of the other resistors is coupled between successive intermediate nodes in the series, and the last resistor RN in the series is coupled between a preceding intermediate node and the feedback node 350. The switches in the first set of switches of the first switch network 330 are coupled across respective resistors in the set of N resistors between the respective nodes as shown in FIG. 1.

Figure 4:
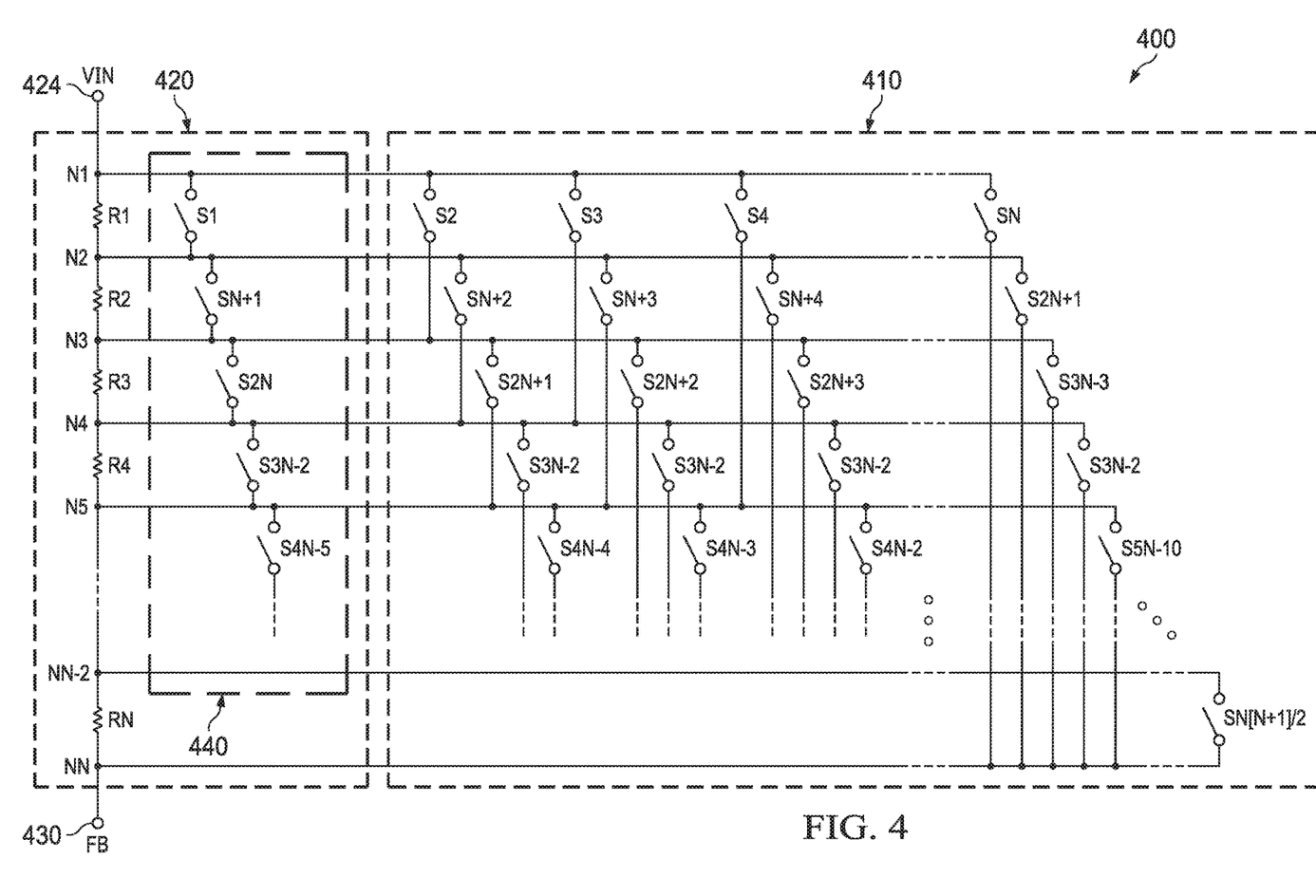
FIG. 4 illustrates an example circuit that includes a compensation switch network to reduce switch resistance of a binary weighted divider.
Figure 5:
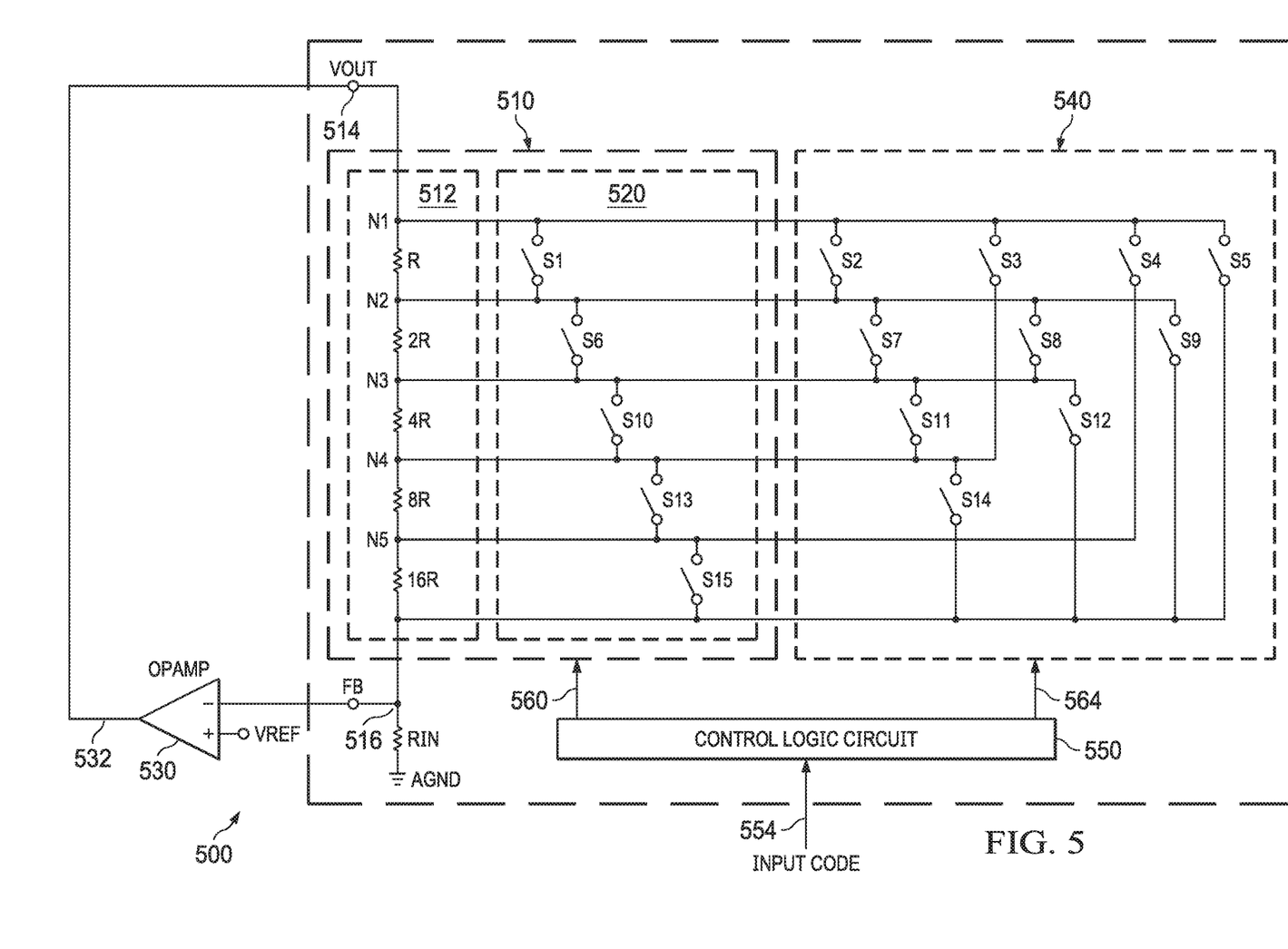
FIG. 5 illustrates an example embodiment of a system that includes a compensation switch network to reduce switch resistance of a binary weighted divider.

An input code used to specify switch settings in the first switch network can be used to activate one or more compensation switches in the set of compensation switches of the compensation switch network 310 according to which of the respective switches in the first set of switches of the first switch network 330 are activated. For example, a control logic circuit (see, e.g., FIG. 6) is configured to activate switches in the first switch network 330 and the compensation switch network 310 based on an input binary code provided to the circuit. The control logic circuit employs the input code to set a resistor control code to activate switches in the first switch network 330 and also uses the input code to set a compensation code to activate switches in the compensation switch network 310. In an example, the circuit 100 is implemented in a power converter (e.g., a DC-to-DC converter) configured to provide the voltage at node at a voltage level that is set accurately based on which of the switches in the switch networks 330 and 310 are selected or deselected (according to the input code). FIGS. 4 and 5 below illustrate examples that can be used to implement the binary weighted divider 320 and the compensation switch network 310.

FIG. 4 illustrates an example circuit 400 that includes a compensation switch network 410 configured to reduce switch resistance of a binary weighted divider 420. The binary weighted divider 420 includes a sequence of N resistors coupled in series and shown as R1 through RN. Resistor R1 is coupled to node N1 which is also coupled to an input node 424 which receives voltage VIN. Resistor R1 is coupled between node N1 and subsequent intermediate node N2. Resistor R2 is coupled between node N2 and node N3. Resistor R4 is coupled between node N4 and N5. Resistor RN is coupled between node N5 in this example and the final node NN which is also coupled to a feedback node 430. Resistor R1 is weighted with a resistance value having a unit value of 1 (e.g., 100Ω, 1 kΩ, or 10 kΩ) and each subsequent resistor to R1 in the sequence is weighted twice the resistor value of the resistor that precedes it in the sequence. For example, R2 is twice the resistance value of R1, R3 is twice the resistance value of R2 and so forth. A first switch network 440 includes switches to select a binary weighted resistance value based on which switches are selected (e.g., deactivated) to couple resistors in the sequence. The compensation switch network 410 includes compensation switches that are activated based on which of the switches in the first switch network 440 are activated.

As shown, switch S1 is coupled to node N1 and across resistor R1 and represents the least significant bit setting for the binary weighted divider 420. Switches S2, S3, S4, and SN are also coupled to node N1 and are configured to compensate for the switch resistance of switch S1. Thus, if N=5 representing 5 resistors and 32-bit combinations, the compensation switches coupled to node 1 if N=5 would be switch S2, S3, S4, and S5 in the compensation switch network 410. Each subsequent node includes one less compensation switch than the number of compensation switches employed to compensate the switch coupled to the preceding node in the sequence. Thus, in this example if N=5, resistor R2, which is coupled in series with resistor R1 at node N2, employs switch SN+1 (S6) as its respective selection switch from the first switch network 440.

The compensation switches coupled to node N2 are configured to compensate for the resistance of switch SN+1 and include switches SN+2, SN+3, up to S2N−1. If N=5 as the preceding example, SN+1 in the first switch network 440 would be S6, SN+2 would be S7, SN+3 would be S8, and SN+4 would be S9. Thus, node N2 would have four compensation switches for a five-bit example, which is one less compensation switch than the five switches coupled to node N1 to compensate for the resistance of switch S1. The succeeding nodes N3, N4 up to node NN each utilize one switch from the first switch network 440 to select the binary weighted value and correspondingly utilize one less compensation switch connected than the preceding node. In this manner, the number of compensation switches can be implemented with a minimum number of switches while still ensuring one or more parallel current paths are activated in compensation switch network 410 to reduce electrical resistance of each activated switch in the first switch network 440.

As mentioned above, the sequence of N resistors R1 through RN includes intermediate nodes between each adjacent pair of resistors between the input node 424 and the feedback node 430. As shown, the set of compensation switches in the compensation switch network 410 includes N−1 compensation switches coupled to the input node 424 at Node 1, where each of the N−1 compensation switches are coupled between the input node and a respective one of the intermediate nodes and the feedback node 430. The number of compensation switches that is coupled to each intermediate node in the sequence of resistors is less than the number of compensation switches coupled to a preceding node in the sequence. In an example, the number of switches representing the set of compensation switches in the compensation switch network and the first switch network 440 is less than or equal to $N/2*(N+1)$, with N representing the number of resistors in the sequence of resistors.

FIG. 5 illustrates an example system 500 that employs a compensation switch network 540 to reduce switch resistance of a binary weighted divider 510. The system 500 includes the binary weighted divider 510 having a resistor network 512 that includes a sequence of N weighted resistors coupled in series between an input node 514 and a feedback node 516. A first set of switches (S1, S6, S10, S13 and S15) 520 is coupled is in series between the input node 514 and the feedback node 516. In this example, a 5-bit divider is shown having 5-weighted resistors in the resistor network 512 but more or less than 5 bit configurations are possible as described herein. The first set of switches 520 (N switches) is configured to set a feedback voltage at the feedback node 516 in response to activating or deactivating respective switches in the first set of switches.

An amplifier 530 is configured to provide an output voltage VOUT from amplifier output 532 to the input node 514 based on a reference voltage shown as VREF received at reference input (+terminal of amplifier) and a feedback voltage received at a feedback input (−terminal of amplifier) from the feedback node 516. A set of compensation switches (S2, S3, S4, S5, S7, S8, S9, S11, S12 and S14) in the compensation switch network 540 is coupled to the first set of switches 520. The set of compensation switches in the compensation switch network 540 is configured to reduce resistance of one or more of the respective switches in the first set of switches 520 that are activated by activating one or more switches in the set of compensation switches to provide one or more respective parallel current paths for the one or more respective switches in the first set of switches that are activated.

A control logic circuit 550 is configured to control activation and deactivation of the first set of switches 520 and the set of compensation switches in the compensation switch network 540 based on an input code 554 to determine a resistance of the binary weighted divider 510. The control logic circuit 550 includes an input adapted to receive the input code 554. The control logic circuit 550 is configured to generate a resistor control code 560 based on the input code 554 to control the first set of switches 520 to set the resistance of the binary weighted divider 510. The control logic circuit 550 is further configured to generate a compensation code 564 based on the input code 554 to activate the compensation switches in the compensation switch network 540 to provide one or more respective parallel current paths for each of the switches in the first set of switches 520 that are activated such that the switch resistance of the activated switches in the first set of switches is reduced.

As an example, the input code may be determined by a user, such as to set a desired voltage across the divider 510 (e.g., between nodes 514 and 516). For example, a user sets a desired input code (e.g., to set the desired voltage), which is communicated to the control logic circuit 550 via communications bus. The control logic circuit 550 is configured to decode the input code and calculate which switches in the first set of switches 520 and compensation switch network 540 will be activated (e.g., shorted) to set the resistance of the divider 510. For example, the input code 554 is a multi-bit digital word that is a binary representation of the desired output voltage level. The input code maybe fixed or, alternatively, may change during operation such as to vary the voltage level accordingly. The control logic circuit 550 is configured to decode the input code at 554 into control signals for each of the switches S1-S15.

For the example of FIG. 5, the control logic circuit 550 is configured to decode the input code as follows:

S1=$\overline{D[0]}$, S2=S1*$\overline{D[1]}$, S3=S2*$\overline{D[2]}$, . . . , S6=$\overline{D[1]}$, S7=S6*$\overline{D[2]}$, . . . , D[4:0], where Sx is control signal for the switch x and
D[4:0] is input code provided at 554.

Figure 6:
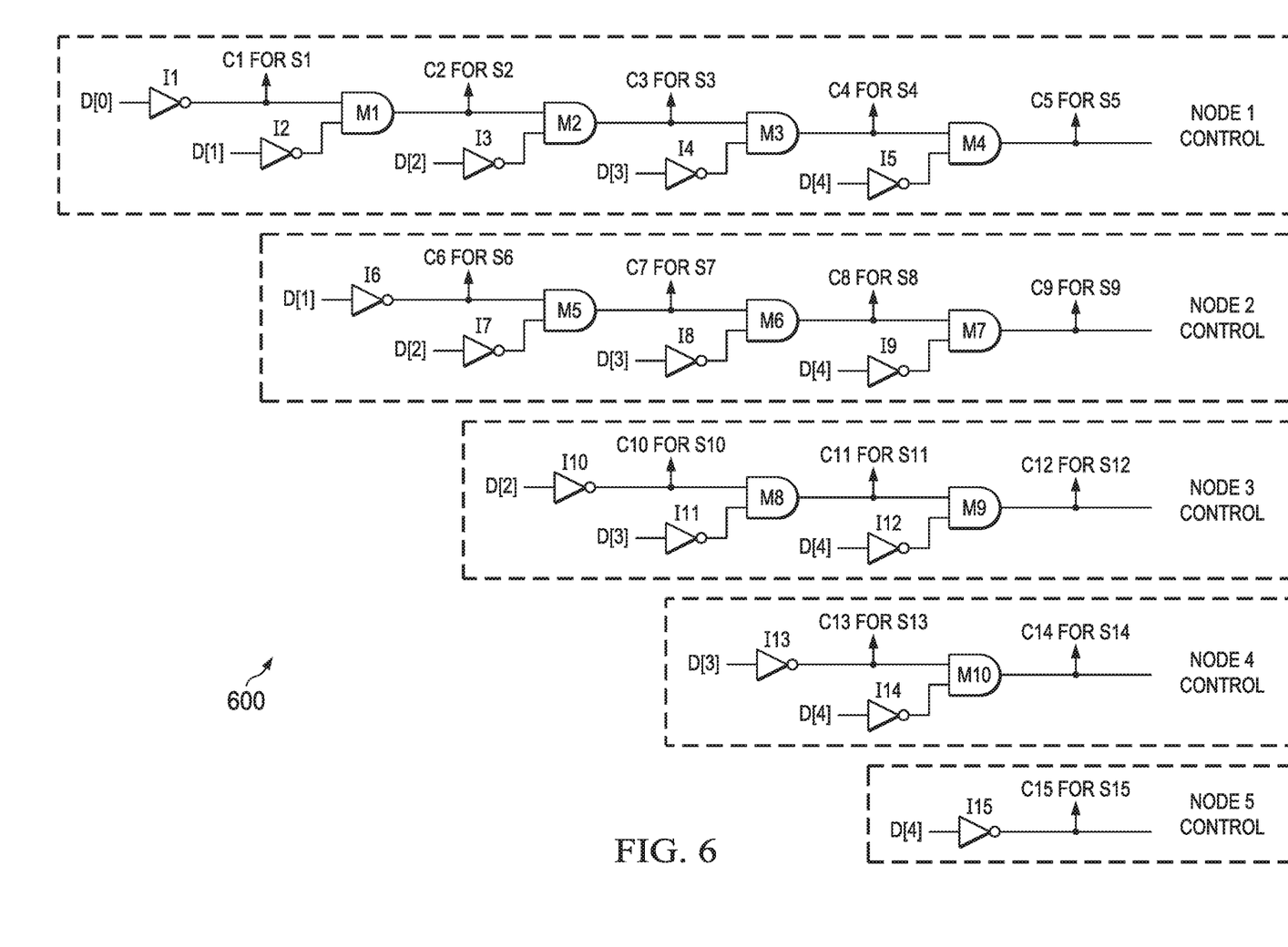
FIG. 6 illustrates an example of control logic circuit to control switches in the circuit of FIG. 5.

An example of the control logic circuit 550 is illustrated and described with respect to FIG. 6.

FIG. 6 illustrates a control logic circuit 600 configured to control the compensation switch network and the binary weighted divider circuit, such as illustrated in FIG. 5. As used herein, the control logic circuit 600 can include discrete components configured to receive an input code represented as binary bits D[0], D[1], D[2], D[3], and D[4] and generate control signals C1 through C15 (e.g., corresponding to signals 560 and 564) for switches S1 through S15 of FIG. 5 based on the input code (e.g., input code at 554). Alternatively or additionally, the control logic circuit 600 can include an integrated control circuit, a controller, microcontroller, gate array, and/or a processor that executes machine-readable instructions to perform its control function to generate the respective control signals C1-C15 based on the input code. In this example control logic circuit 600, an AND gate and inverter implementation is shown to perform the control function. In other examples, the AND gates shown in the control logic circuit 600 could be replaced by OR gates with corresponding non-inverting buffers used in place of the inverters shown. In other examples, the discrete logic shown in the control logic circuit 600 could be replaced by controller instructions that read the input code and generate the corresponding control signals C1-C15 based on the input code.

In the example control logic circuit 600, the first switch network described herein is controlled from control signals C1, C6, C10, C13, and C15. These controls are derived from the input code and define resistor control codes to operate respective switches of the first switch network (e.g., 330, 420, 510) as described herein. Control signals C2, C3, C4, C5, C7, C8, C9, C11, C12, and C14 are also derived from the input code and define compensation control codes to operate compensation switches of the compensation switch network (e.g., 310, 410, 540) described herein. The control signals C1 through C5 are collectively referred to as Node 1 Control and control the binary weighted divider setting for the switch that defines the least significant bit of the divider selected by switch S1 and the corresponding compensation switch controls C2, C3, C4, and C5 for the compensation switches also connected to S1 and are also connected to the input node described herein. As mentioned, each subsequent node in the sequence utilizes one less compensation switch and thus needs one less control gate to operate the respective nodes, such as shown as Node 2 Control, Node 3 Control, Node 4 Control, and Node 5 Control.

As shown with respect to Node Control 1, input code D[0] drives inverter I1 to generate control C1 which is also applied to gate M1. Gate M1 also receives inverted D[1] from I2 and the output from I1 to generate control signal C2, which is applied to gate M2. Gate M2 receives inverted D[2] from I3 and generates control signal C3. Gate M3 receives inverted D[3] from I4 and the output from M2 to generate control signal C4, which is applied to gate M4. Gate M4 receives inverted D[4] from I5 and generates control signal C5.

Each of the other Nodes 2-4 is configured to operate similarly to Node 1. For example, Node 2 Control includes inverters I6, I7, I8, and I9 and gates M5, M6, and M7 configured to generate control signals C6, C7, C8, and C9 in response to input codes D[1], D[2], D[3], and D[4]. Node 3 Control includes inverters I10, I11, and I12 and gates M8 and M9 configured to generate control signals C10, C11, and C12 in response to input codes D[2], D[3], and D[4]. Node 4 Control includes inverters I13 and I14 and gate M10 configured to generate control signals C13 and C14 in response to input codes D[3] and D[4]. Node 5 Control includes inverter I15 configured to generate control signal C15 in response to input code D[4].

The control logic circuit 600 thus is configured to control activation and deactivation of the first set of switches and the set of compensation switches based on the input code such as specified from bits D[0] through D[4]. The control logic circuit 600 includes an input, such as a discrete logic input circuit or a processor input circuit. For example, the input code is stored in a register or other memory device. Thus, the control logic circuit 600 is adapted to receive the input code and is configured to generate a resistor control code (e.g., controls C1, C6, C10, C13, and C15) based on the input code to control the first set of switches to set the resistance of the binary weighted divider. For example, the control logic circuit 600 is configured to activate one or more compensation switches in the set of compensation switches according to which of the respective switches in the first set of switches are activated to reduce switch resistance of the activated switches. The control logic circuit is further configured to generate a compensation code (e.g., control signals C2, C3, C4, C5, C7, C8, C9, C11, C12, C14, and C15) based on the input code to activate the compensation switches to provide one or more respective parallel current paths for each of the switches in the first set of switches that are activated such that the switch resistance of the activated switches in the first set of switches is reduced.

Figure 7:
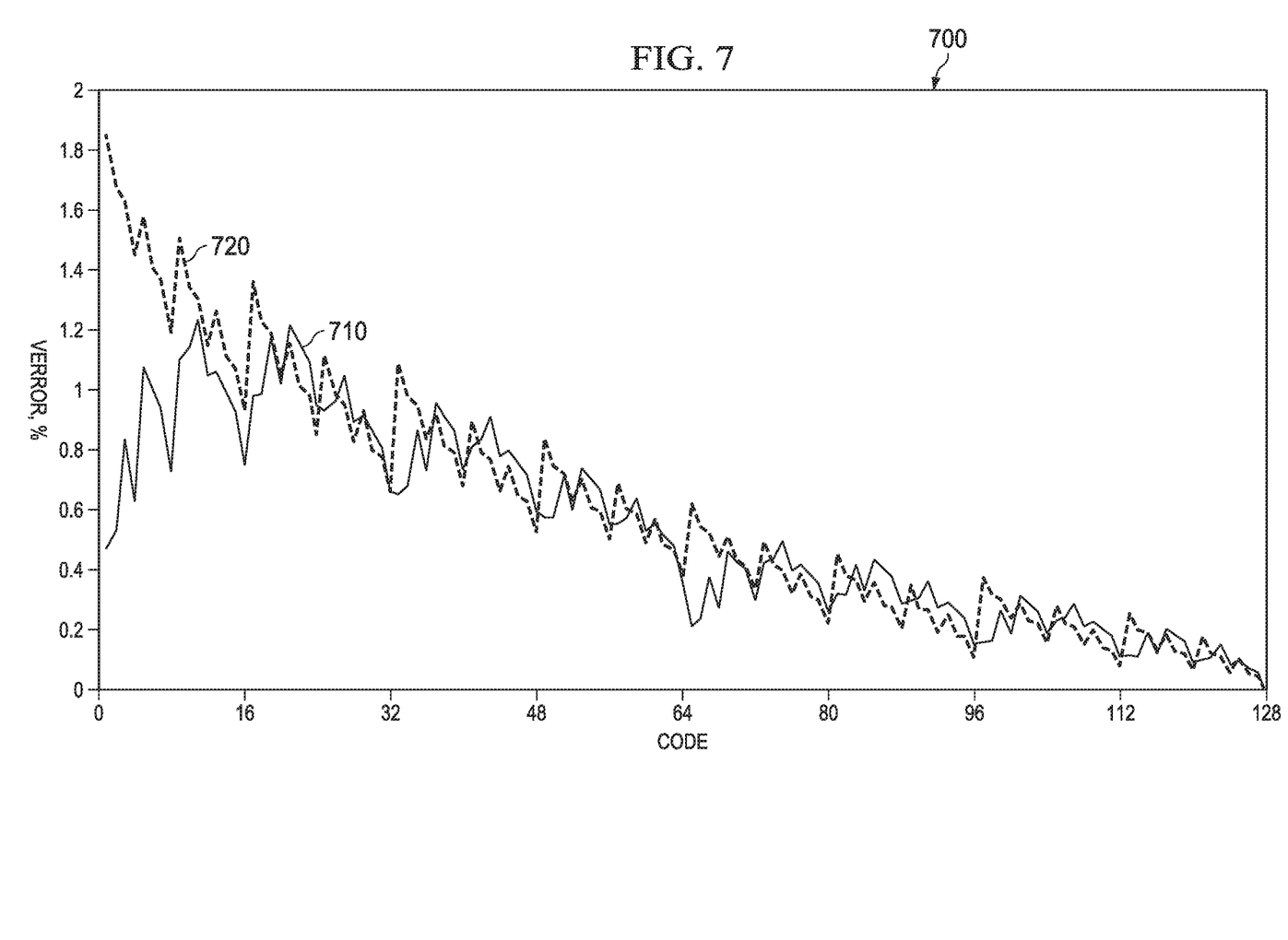
FIG. 7 illustrates a diagram of a voltage error as a function of an input code demonstrating improved accuracy of a binary weighted divider that includes a compensation switch network compared to the existing binary weighted divider of FIG. 2, where the total integrated circuit switch area between the improved divider and the existing divider is about the same.

FIG. 7 illustrates a diagram 700 of voltage error as a function of an input code demonstrating improved accuracy based on simulated results of a binary weighted divider that includes a compensation switch network at curve 710 compared to an existing binary weighted divider providing curve 720 and similar to the example of FIG. 2. In this comparison, the total integrated circuit switch area of the first switch network used for each of the improved divider and existing divider implementations is about the same from which the simulation of curve 710 and curve 720 are generated from. On the vertical axis of the diagram, 700, the error is represented as a percent and calculated as Verror=[(Vbwd−Videal)/Videal]*100%, where Vbwd represents binary weighted divider voltage at the feedback node based on switch selection and resistor tolerances set outside their stated values and Videal represents ideal voltage output at the feedback node of the divider under ideal conditions where resistors are simulated at stated values. The horizontal axis on the diagram represents various divider bit output settings including 0, 16, 32 . . . up to 128-bit divider performance on the right of the horizontal axis on the diagram 700.

As shown for the least significant bits 0 through 16, the curve 710 generated with compensation switches activated has a lower percentage of output voltage error as the curve 720 that does not employ compensation as described herein. For instance, with a binary setting of 16 on the horizontal axis, the curve 710 demonstrates a voltage error in percentage of less than 0.8% whereas the curve 720 shows voltage error percentage of almost 1.4 percent error. At the setting of 0 on the horizontal axis, the curve 710 where compensation is employed is slightly above 0.5% error whereas the curve 720 where no compensation was used shows over 1.8% error.

Figure 8:
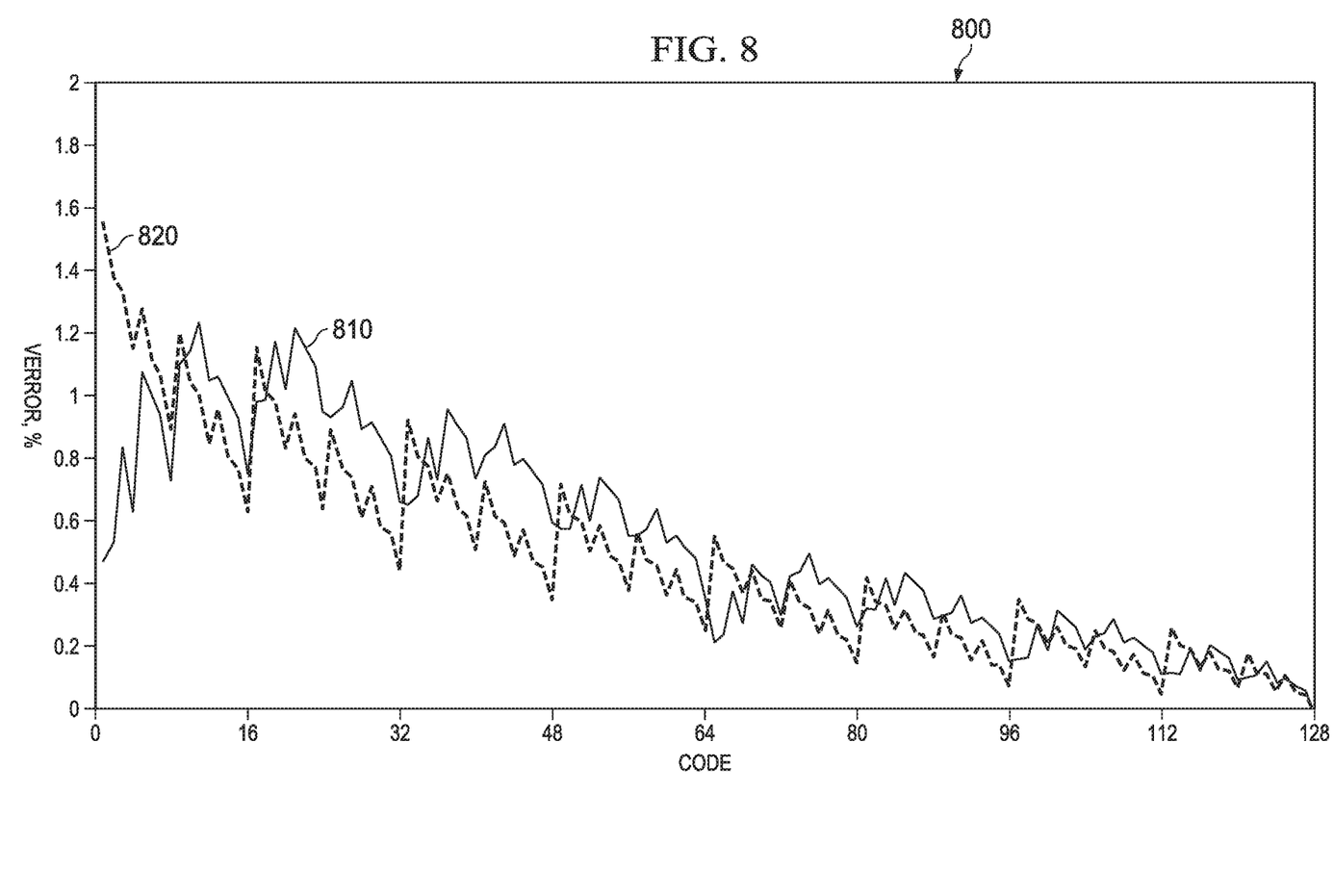
FIG. 8 illustrates a diagram of a voltage error as a function of an input code demonstrating improved accuracy of a binary weighted divider that includes a compensation switch network compared to the existing binary weighted divider of FIG. 2, where the total integrated circuit switch area implemented for the existing divider is greater than the improved divider.

FIG. 8 illustrates a diagram 800 of voltage error as a function of an input code demonstrating improved accuracy based on simulated results of a binary weighted divider that includes a compensation switch network at curve 810 compared to an existing binary weighted divider providing curve 820 and similar to the example of FIG. 2. In contrast to the diagram 700 shown in FIG. 7, the total integrated circuit switch area implemented for the first switch network of the existing divider is greater than employed for the first switch network of the improved divider. Similar to the diagram 700 described above, error percentage of the output voltage for the divider is represented on the vertical axis where differing bit settings to generate the respective output voltages is represented on the horizontal axis of the diagram 800.

As shown for the least significant bits 0 through 16, the curve 810 generated with compensation switches activated has a lower percentage of output voltage error as the curve 820 that does not employ compensation as described herein. At the setting of 0 on the horizontal axis for example, the curve 810 where compensation is employed is slightly above 0.5% error whereas the curve 820 where no compensation was used shows almost 1.6% error. It is noted that in this example, the switch area for the switches used to generate the curve 820 were increased by 25% over the example shown at 720 of FIG. 7 yielding a slight improvement for the divider (e.g., 1.6% versus 1.8% error). However, as shown, the curve 820 improves LSB performance over existing implementations that attempt to improve accuracy by implementing larger switches to lower their respective resistance. The compensation switch network described herein allow the combined number of switches contained in both the first switch network and the compensation switch network to be implemented in a smaller die are that existing dividers that attempt to improve accuracy by implementing larger switches.

Figure 9:
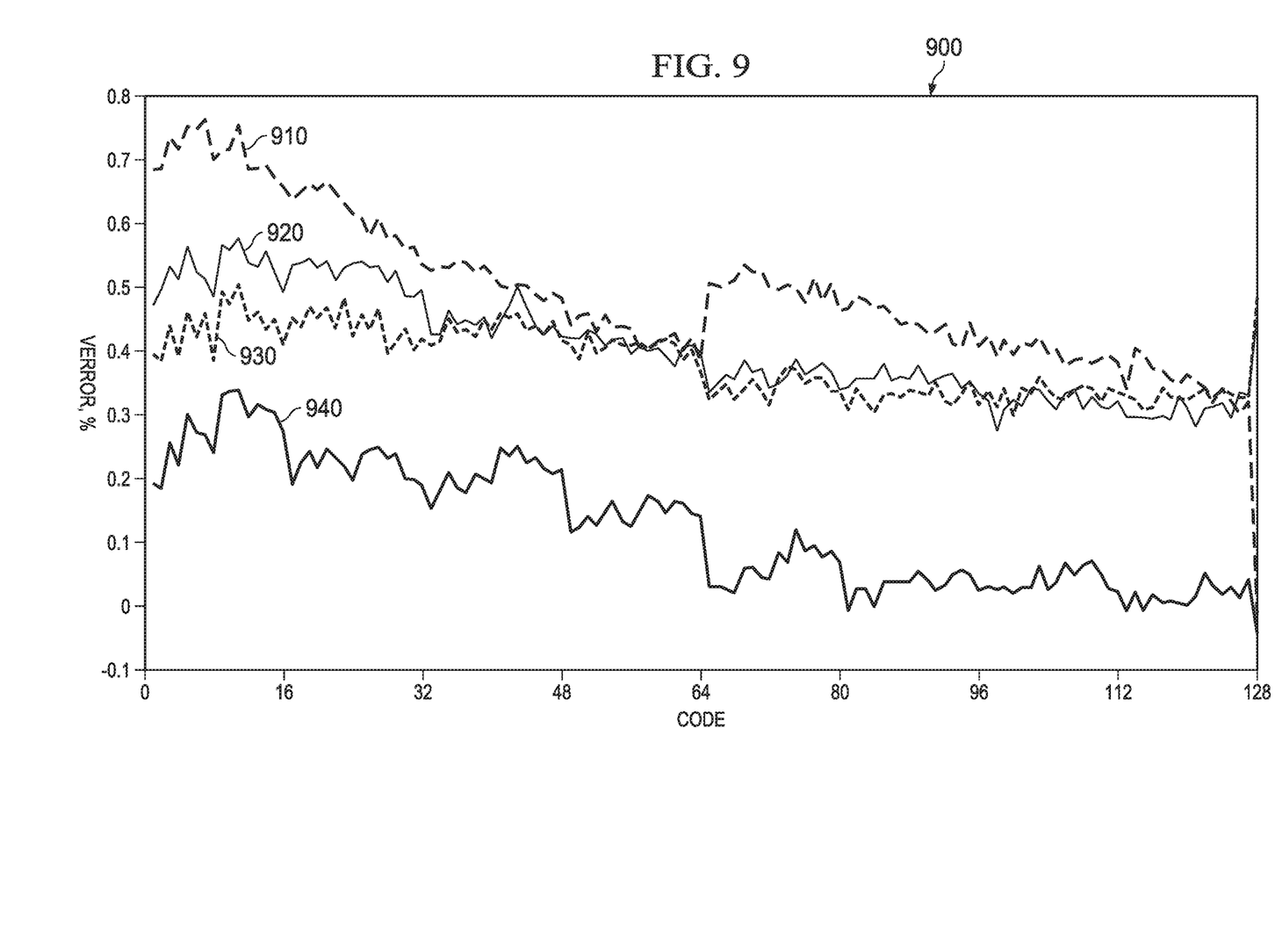
FIG. 9 illustrates a diagram that voltage error as a function of an input code for different samples of a binary weighted divider using a compensation switch network.

FIG. 9 illustrates a diagram 900 that depicts output voltage accuracy for differing manufactured samples of a binary weighted divider using a compensation switch network. In this example, actual production samples of a binary weighted divider using a compensation switch network are represented and measured at a temperature of 85 degrees Celsius. Four different samples represented on curve 910, curve 920, curve 930, and curve 940 were measured showing output voltage error percentage on the vertical axis versus binary settings on the horizontal axis. Each of the measured results shown on the curve 910, curve 920, curve, 930, and curve 940 has a lowered measured error percentage on the vertical axis than the worst-case simulated results depicted in the curves of FIGS. 7 and 8.

Figure 10:
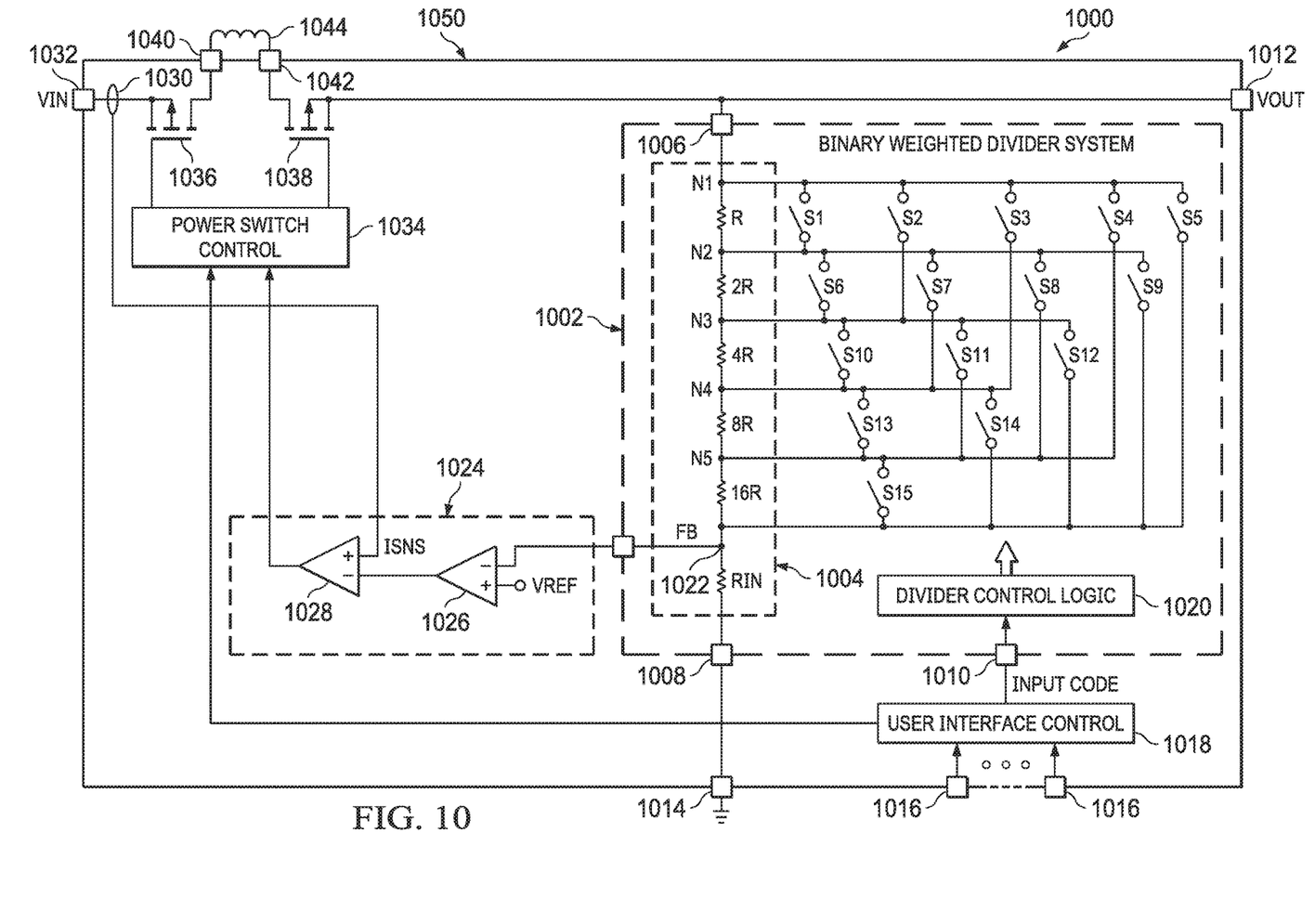
FIG. 10 illustrates an example of a DC-DC converter that includes a binary weighted divider.

FIG. 10 illustrates an example of a DC-DC converter 1000 that includes a binary weighted divider system 1002. For example, the binary weighted divider system 1002 may be implemented according to the examples disclosed herein, including the system 300 of FIG. 3, the system 400 of FIG. 4, or the system 500 of FIG. 5. The binary weighted divider system 1002 includes a string of resistors 1004 coupled between nodes 1006 and 1008. The binary weighted divider system 1002 is configured to set a resistance between the nodes 1006 and 1008 in response to an input code provided at 1010. In the example, of FIG. 5, each of the resistors has an increasing resistance demonstrated as R, 2R, 4R, 8R and 16R, where R denotes a unit resistance value.

The node 1006 is coupled to an output terminal 1012 of the DC-DC converter 1000 to provide a corresponding output voltage VOUT. In the example of FIG. 10, the node 1008 is connected to another terminal 1014, which can be coupled to electrical ground or another low voltage. An arrangement of one or more terminals 1016 may provide a communication port coupled to receive input instructions according to a communication protocol. As an example, the terminals 1016 correspond to port of an I$^2$C bus that is configured to provide the user input instructions as a series of pulses to a user interface control 1018 of the converter 1000.

The user interface control 1018 is configured to convert the input instructions (e.g., pulses) received at terminals 1016 into a corresponding input code such as disclosed herein. For example, the user control interface 1018 is configured to extract serial pulses from the terminals 1016 and converts the pulses to corresponding input code data (e.g., multi-bit binary data). The input code can be a multi-bit binary word representative of a resistance for the resistor string 1004 and/or the voltage VOUT to be provided at the output terminal 1012. The user control interface 1018 provides the input code data to divider control logic circuit 1020 of the divider system 1002. For example, the divider control logic 1020 corresponds to control logic circuit 550 of FIG. 5 and logic circuit 600 of FIG. 6. The divider control logic 1020 is configured to convert the input code into a set of switch control signals that are provided to each of a plurality of switches in the binary weighted divider system 1002. In the example of FIG. 10, the switches includes switches S1-S15, such as disclosed with respect to FIG. 5. In other examples, different numbers and configurations of switches may be used and the switch decoder logic appropriately configured to provide control signals to the respective switches. The divider control logic 1020 thus decides which one or more switches (S1-S15) will be shorted based on the input code data.

In the example converter 1000 of FIG. 10, a node 1022 at the juncture between the last resistor (having resistance 16R) and an input resistance (RIN) of the binary weighted divider system 1002 is coupled to an input of a feedback circuit 1024. The node 1022 provides a feedback signal representative of the output voltage or current through the resistor string 1004. For example, the feedback signal is provided to an inverting input of an operational amplifier (op-amp) 1026. A reference voltage $V_{REF}$ is provided to the non-inverting input of the op-amp 1026. The output of the op-amp 1026 is connected to a negative input of a comparator 1028. A current sensor 1030 is configured to monitor the current supplied to an input terminal 1032 in response to an input voltage VIN. The current sensor 1030 supplies an indication of the sensed current (e.g., a voltage across a sense resistor—not shown) to the positive input of comparator 1028. The comparator 1028 is configured to provide a comparator signal to a power switch control 1034 based on a comparison of the sense input current and the output of the op-amp 1026. In an example, the user interface control 1018 also supplies a control signal to another input of the power switch control 1034, such as to selectively enable or disable the power switch control circuit 1034. The power switch control 1034 is connected to drive switch devices 1036 and 1038 based on the comparator output signal provided by comparator 1028. For example, the switch devices 1036 and 1038 may be implemented as metal oxide semiconductor field effect transistor (MOSFET) switch devices. In other examples, different types of transistors (e.g., bipolar junction transistors, junction gate field-effect transistor) may be used for switches 1036 and 1038. The switch device 1036 is connected between terminal 1032 and a terminal 1040 and switch device 1038 is connected between a terminal 1042 and the output terminal 1012. An inductor (e.g., an external inductor) 1044 may be connected between terminals 1040 and 1042.

The power switch control 1034 is configured to control switch devices 1036 and 1038 (e.g., by driver circuitry coupled to drive the gates of MOSFET devices) to supply current through the inductor 1044. The current is thus is provided through the binary weighted divider system 1002 to produce a corresponding output voltage VOUT at 1012 based on the resistance of the binary weighted divider. As disclosed herein, the resistance varies based on the input code that is supplied to the divider control logic 1020 in response to the instruction signals received at terminals 1016. As mentioned, the instruction signals supplied to 1016 may vary over time and thereby change the resistance that is connected between nodes 1006 and 1008 of the binary weighted divider system. The DC-DC converter thus may be encapsulated within a molded packaging material (e.g., a thermosetting polymer or thermoplastic material) to form an integrated circuit chip or multi-chip package structure 1050. For example, the package structure 1050 can include includes the terminals 1012, 1014, 1016, 1032, 1040 and 1042. The terminals 1014, 1016, 1032 of the package thus are adapted to receive respective signals and voltage levels to operate the DC-DC converter 1000, and an external (or internal) inductor may be coupled to terminals 1040 and 1042.

By way of further example, the DC-DC converter is designed to produce the output voltage VOUT within a range of voltages according to a step size (e.g., in the range VOUT=1.9V-5V in steps of 100 mV). A 5-bit divider is sufficient to cover this range, such as shown in the example of FIG. 10 (as well as in FIGS. 5 and 6). In this 5-bit example, the input code ranges from 0 (Decimal) to 31 (Decimal), such that when the input code is 0 (Decimal), VOUT=1.9V, and when the input codes is 31 (Decimal), VOUT=5V. The user control interface 1016 receives signal pulses gets that include input instructions representing the desired output voltage. For example, the ports 1016 are coupled to a bus or a control register to receive the signal representing the desired voltage. The user control interface converts the signal received at 1016 to the multi-bit code (e.g., a 5-bit word). In response to the input code being set at 1010, the divider control logic 1020 is configured to provide switch control signals to control which switches S1-S15 will be shorted and which will be opened. As disclosed herein, the activation of auxiliary switches S2, S3, S4, S5, S7, S8, S9, S11, S12 and S14, which are connected in parallel with individual and series resistors of the resistor string 1004, will reduce the switch resistance of the divider. When the input code (i.e., switch resistance) is set and switches are activated and deactivated accordingly, the feedback circuit 1024 in the DCDC converter will adjust VOUT in such a way that the feedback voltage is equal to the voltage VREF (e.g., a stable voltage level). That is, the feedback circuit 1024 is configured to force the voltage VFB=VREF. For example, the voltage VFB may be represented as follows:

$$VFB = R_{in}/(R_{in} + \text{Sum\_of\_R}) * VOUT,$$

where Sum_of_R is the sum of the resistance looking from node 1006 to 1022.

In order to set the desired VOUT, the Sum_of_R is changed according to the input code. As mentioned, due to op-amp, VFB=VREF (e.g., VFB is set to a fixed DC voltage). Because the Sum_of_R is equal to a resistance that is set (e.g., fixed) in response to the input code, the power switch control 1034 of the DC-DC converter 1000 adjusts VOUT by controlling current to through the switches 1036 and 1038 to provide VFB=Vref. This same feedback mechanism and use of divider circuit may be utilized in other power converters. As disclosed herein, the binary weighted divider system 1002 thus can improve the desired voltage that is to be provided in the approved over existing divider circuits. The binary weighted divider system 1002 may be implemented in a variety of different circuit topologies and power converters according to application requirements.

What have been described above are examples. It is, of course, not possible to describe every conceivable combination of components or methods, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:
1. A circuit, comprising:
a binary weighted divider comprising:
a resistor network having a first terminal and a second terminal, the resistor network comprising:
a first resistor having a first resistor terminal, a second resistor terminal, and a first resistance, the first resistor terminal coupled to the first terminal;
a second resistor having a third resistor terminal, a fourth resistor terminal, and a second resistance, the third resistor terminal coupled to the second resistor terminal; and
a third resistor having a fifth resistor terminal, a sixth resistor terminal, and a third resistance, the fifth resistor terminal coupled to the fourth resistor terminal, the first resistance less than the second resistance, and the second resistance less than the third resistance;
first switches coupled in series between the first terminal and the second terminal, the first switches configured to set a feedback voltage at the second terminal in response to closing or opening one or more of the first switches; and
second switches coupled to the first switches, the second switches configured to reduce resistance of the one or more of the first switches by closing one or more of the second switches.

2. The circuit of claim 1, wherein switches of the first switches are coupled in parallel across the resistor network.

3. The circuit of claim 2, further comprising a control circuit configured to control closing and opening the one or more of the first switches and the second switches based on an input code.

4. The circuit of claim 3, wherein the control circuit is configured to close the one or more of the second switches according to determining which of the respective switches in the first switches are closed.

5. The circuit of claim 2, wherein
the resistor network comprises N resistors; and
the second switches are N−1 switches coupled to the first terminal, switches of the second switches being coupled between the second terminal and a respective terminal of a respective resistor of the resistor network.

6. The circuit of claim 2, wherein a number of second switches and a number of first switches is less than or equal to N/2*(N+1), N being a number of resistors in the resistor network.

7. The circuit of claim 3, wherein the control circuit has an input adapted to receive the input code, the control circuit is configured to produce a resistor control code based on the input code to control the first switches to set a resistance of the binary weighted divider, the control circuit is further configured to produce a compensation code based on the input code to close the second switches to provide one or more respective parallel current paths for the switches of the first switches that are closed.

8. The circuit of claim 1, further comprising an amplifier configured to produce a signal at an amplifier output to drive the first terminal based on a voltage at the second terminal and based on a reference voltage, the feedback voltage being set based on which of the first switches are closed.

9. The circuit of claim 1, wherein the binary weighted divider and the second switches reside on a substrate of an integrated circuit chip.

10. A circuit, comprising:
a resistor network having a first terminal and a second terminal, the resistor network comprising:
a first resistor having a first resistor terminal and a second resistor terminal, the first resistor terminal coupled to the first terminal; and
a second resistor having a third resistor terminal and a fourth resistor terminal, the third resistor terminal coupled to the second resistor terminal;
a first switch having a first switch terminal and a second switch terminal, the first switch terminal coupled to the first resistor terminal and the second switch terminal coupled to the second resistor terminal;
a second switch having a third switch terminal and a fourth switch terminal, the third switch terminal coupled to the third resistor terminal and the fourth switch terminal coupled to the fourth resistor terminal;
a third switch having a fifth switch terminal and a sixth switch terminal, the fifth switch terminal coupled to the first resistor terminal and the sixth switch terminal coupled to the second resistor terminal;
a fourth switch having a seventh switch terminal and an eighth switch terminal, the seventh switch terminal coupled to the third resistor terminal and the eighth switch terminal coupled to the fourth resistor terminal; and
an amplifier having an amplifier output, a first amplifier input, and a second amplifier input, the first amplifier input coupled to the second terminal, the second amplifier input configured to receive a reference voltage, and the amplifier output coupled to the first terminal.

11. The circuit of claim 10, wherein the first resistor, the first switch, the second resistor and the second switch form at least a portion of a binary weighted divider, and the third switch and the fourth switch are at least a portion of a compensation network, the compensation network configured to reduce resistance of one or more switches of the binary weighted divider.

12. The circuit of claim 11, wherein the binary weighted divider comprises:
N resistors, including the first and second resistors, coupled in series between a first terminal and a second terminal, N being a positive integer greater than two, the N resistors having increasing resistance from the first terminal to the second terminal; and
N switches, including the first and second switches, each of the N switches being coupled in parallel across a respective one of the N resistors, the compensation network configured to provide one or more respective parallel current paths for each of the N switches in the binary weighted divider that is closed.

13. The circuit of claim 12, further comprising a control circuit configured to control closing and opening the N switches in the binary weighted divider based on an input code, to set a resistance of the binary weighted divider.

14. The circuit of claim 13, wherein the compensation network comprises:
N−1 switches, including the third switch, coupled to the first resistor terminal, each of the N−1 switches being coupled between the first resistor terminal and a terminal of a resistor of the N resistors;
N−2 compensation switches, including the fourth switch, coupled to the second resistor terminal, each of the N−2 resistors being coupled between the second resistor terminal and a terminal of a resistor of the N resistors.

15. The circuit of claim 13, wherein the control circuit is configured to close one or more switches in the compensation network according to which switches in the binary weighted divider are closed.

16. The circuit of claim 12, wherein a number of switches in the compensation network and a number of switches in the binary weighted divider is less than or equal to N/2*(N+1).

17. The circuit of claim 12, wherein the amplifier has a first input, a second input, and an output, the second terminal coupled to the second terminal, the second input configured to receive the reference voltage, wherein the amplifier is configured to produce a signal at the amplifier output to drive the first terminal based on a voltage at the second terminal and based on the reference voltage, the voltage indicating which of switches in the binary weighted divider are closed.

18. A system, comprising:
a binary weighted divider, comprising:
a resistor network comprising resisters coupled in series between a first terminal and a second terminal; and
first switches coupled in series between the first terminal and the second terminal, the first switches configured to set a feedback voltage at the second terminal in response to closing or opening switches of the first switches;
an amplifier configured to provide an input voltage to the first terminal based on a reference voltage and based on the feedback voltage;

second switches coupled to the first switches, the second switches configured to reduce resistance of one or more of the first switches by closing one or more of the second switches; and a control circuit configured to control closing and opening the first switches and the second switches based on an input code.

19. The system of claim 18, wherein the control circuit has an input configured to receive the input code, the input code indicating a resistance of the binary weighted divider, the control circuit configured to produce a resistor control code based on the input code, to control the first switches to set a resistance of the binary weighted divider, the control circuit further configured to produce a compensation code based on the input code, to control the second switches.

20. The system of claim 19, further comprising a power converter having a power converter input and a power converter output, the power converter output coupled to the first terminal of the binary weighted divider, the power converter comprising:

a switch network coupled between the power converter input and the power converter output;

a switch controller configured to control the switch network to supply current to the resistor network, an output voltage at the power converter output varying based on a current and a resistance of the binary weighted divider; and a feedback circuit comprising the amplifier, the feedback circuit coupled between the second terminal of the binary weighted divider and the switch controller, the feedback circuit configured to provide a feedback signal to the switch controller based on the output voltage at the power converter output.

21. The system of claim 20, wherein the binary weighted divider, the control circuit, the switch network, the switch controller and the feedback circuit are integrated in molded package structure.

22. A system comprising:

a binary weighted divider circuit having a first terminal and a second terminal, the binary weighted divider circuit comprising:

a resistor network comprising resisters coupled in series between the first terminal and the second terminal;

first switches coupled in series between the first terminal and the second terminal, the first switches configured to set a voltage at the second terminal in response to closing or opening switches of the first switches;

second switches coupled to the first switches, the second switches configured to reduce resistance of one or more of first switches by closing one or more switches in the second switches; and a control circuit configured to control closing and opening the first switches and the second switches based on an input code;

a switch network coupled between the first terminal and the second terminal;

a switch controller configured to control the switch network to supply current to the resistor network based on a feedback signal, an output voltage at the second terminal varying based on a current and a resistance between the first terminal and the second terminal; and a feedback circuit configured to provide the feedback signal based on a signal at the second.

23. The system of claim 22, wherein the system is encapsulated within a molded package structure.

24. The system of claim 22, wherein a number of switches in binary weighted divider is less than or equal to N/2*(N+1), wherein N is a number of the resistors.

* * * * *